United States Patent [19]

Cellier et al.

[11] Patent Number: 5,308,707
[45] Date of Patent: May 3, 1994

[54] TREATMENT PROCESS FOR DEPOSITING A LAYER OF CARBON IN VAPOUR PHASE ON THE SURFACE OF A METAL ARTICLE AND ARTICLE THUS OBTAINED

[75] Inventors: Francois Cellier, Firminy; Jean-Francois Nowak; Patrick Choquet, both of Saint-Etienne, all of France

[73] Assignee: Nitruvid, Argenteuil, France

[21] Appl. No.: 956,982

[22] Filed: Oct. 6, 1992

[30] Foreign Application Priority Data

Oct. 7, 1991 [FR] France ................................ 91 12322

[51] Int. Cl.$^5$ ..................... B32B 15/04; C23C 8/24; C23C 16/02; C23C 16/26
[52] U.S. Cl. .................... 428/610; 427/249; 427/577; 427/590; 148/206
[58] Field of Search ............ 427/590, 577, 249; 428/610; 148/206

[56] References Cited

U.S. PATENT DOCUMENTS

| | | | |
|---|---|---|---|
| 3,230,110 | 1/1966 | Smith | 427/249 |
| 3,368,914 | 2/1968 | Darnell et al. | 427/249 |
| 3,656,995 | 4/1872 | Reedy | 427/249 |
| 3,684,585 | 8/1972 | Stroup et al. | 427/249 |
| 3,900,592 | 8/1975 | Kennedy et al. | 427/577 |
| 4,414,085 | 11/1983 | Wickersham et al. | 204/192 C |
| 4,996,079 | 2/1991 | Itoh | 427/577 |

FOREIGN PATENT DOCUMENTS

| | | |
|---|---|---|
| 0403986 | 12/1990 | European Pat. Off. |
| 3639469 | 7/1987 | Fed. Rep. of Germany ...... 427/249 |
| 3939809 | 6/1991 | Fed. Rep. of Germany |
| 4211829 | 11/1992 | Fed. Rep. of Germany ...... 427/577 |
| 2596775 | 10/1987 | France ............................. 427/249 |
| 51-38243 | 3/1976 | Japan ................................. 427/249 |
| WO90/04044 | 4/1990 | PCT Int'l Appl. |

OTHER PUBLICATIONS

Patent Abstracts of Japan, vol. 14, No. 334 (C-742)(4277), Jul. 18, 1990, & JP-A-2-122-075, May 9, 1990, Morihiro Okada, et al., "Coating Method With Hard Carbon Film".

Journal of Vacuum Science & Technology A, vol. 5, No. 6, pp. 3287-3312, Nov., 1987, Hsiao-chu Tsai, et al., "Characterization of Diamondlike Carbon Films and Their Application as Overcoats on Thin-Film Media for Magnetic Recording".

*Primary Examiner*—John Zimmerman
*Attorney, Agent, or Firm*—Oblon, Spivak, McClelland, Maier & Neustadt

[57] ABSTRACT

The process with a view to imparting to the treated article a resistance to frictional wear, a corrosion resistance, and a color, is characterized according to the invention in that the surface of the article is subjected to a thermochemical pretreatment under electric plasma in a vessel under an atmosphere containing reactive species such as $N_2$ and hydrogen, the reactive species diffusing into and precipitating in the metal matrix of the article to form a diffusion sublayer and in that a layer of carbon in vapor phase is deposited under electric plasma on the surface thus treated, in the same vessel, the composition of the atmosphere for the pretreatment being gradually modified, on the one hand, by the introduction of a hydrocarbon and/or of a silane in the gaseous state and, on the other hand, by progressive reduction of the partial pressures of the reactive species employed during the pretreatment, and the maintenance of the hydrocarbon atmosphere for the carbon deposition.

21 Claims, 4 Drawing Sheets

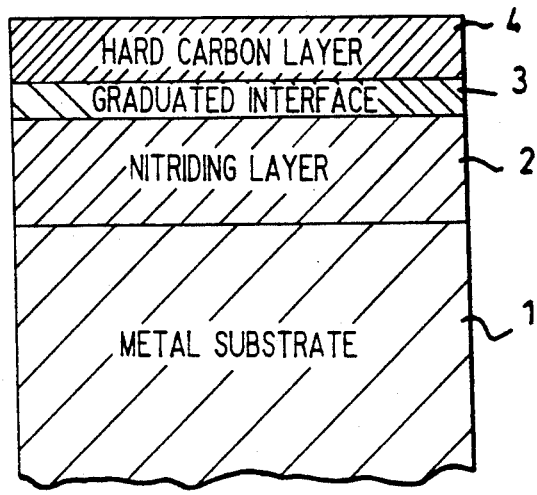
FIG·1
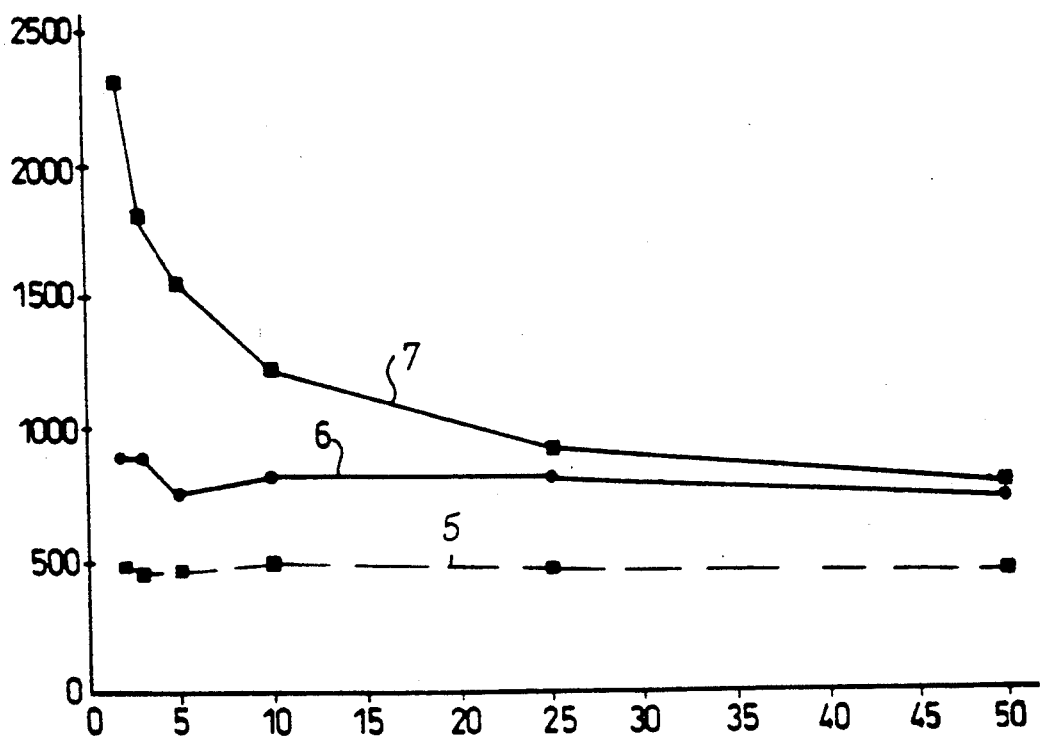
FIG·2

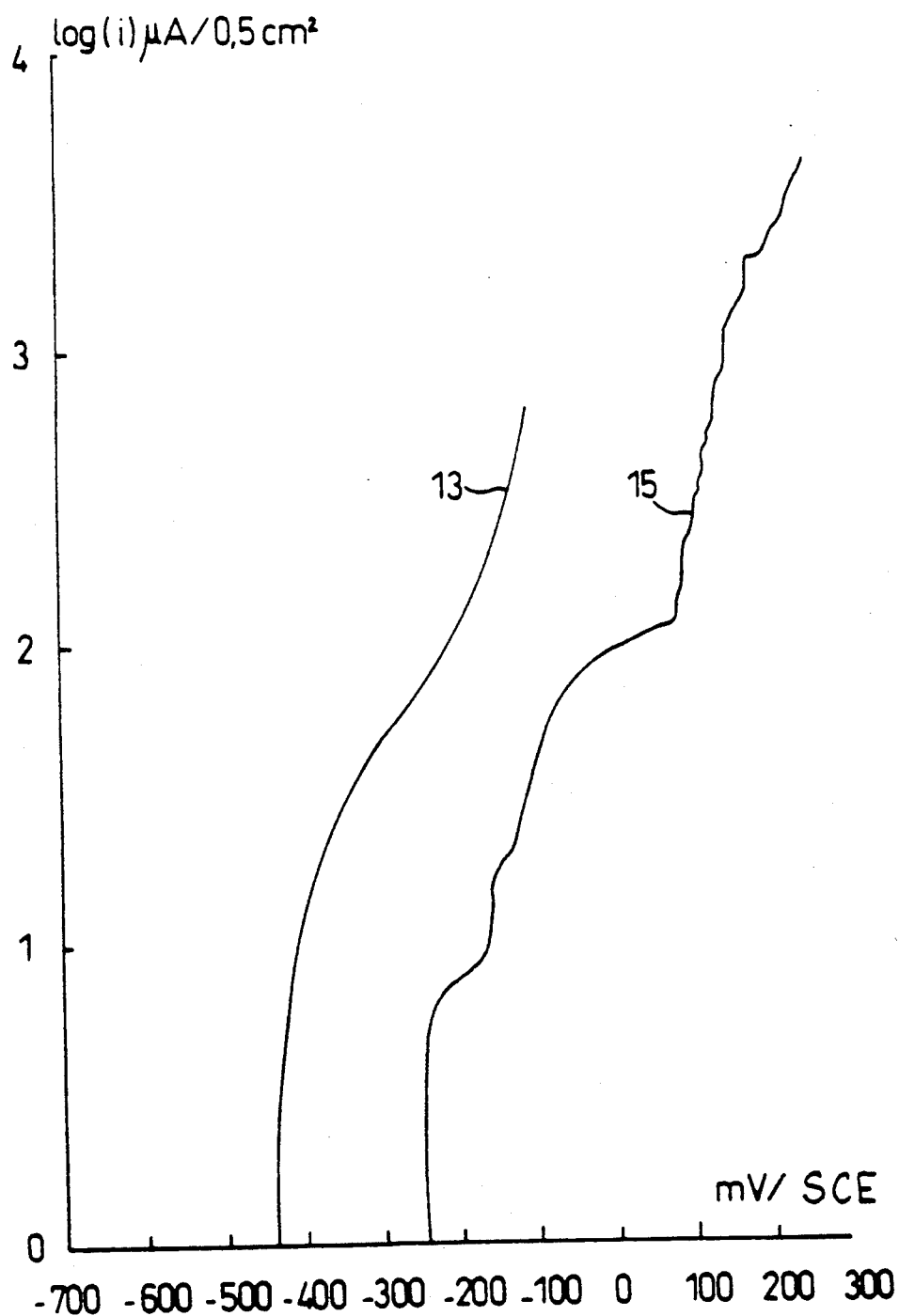
FIG·5

TREATMENT PROCESS FOR DEPOSITING A LAYER OF CARBON IN VAPOUR PHASE ON THE SURFACE OF A METAL ARTICLE AND ARTICLE THUS OBTAINED

FIELD OF THE INVENTION

The present invention relates to a treatment process for depositing a layer of carbon, in vapor phase, in a vessel, on the surface of a metal article to impart to this article a resistance to frictional wear, a corrosion resistance and a color.

DESCRIPTION OF PRIOR ART

There are known processes for producing a thin layer of amorphous hard carbon, called carbon I-C, deposited on substrates in order to give them improved tribological and corrosion-resistance properties.

All these processes are vacuum or low-pressure deposition processes, generally with the aid of a plasma in order to decompose and ionise the reactive species employed.

Industrial development of layers of amorphous hard carbon is limited mainly as a result of the adhesiveness problems encountered, especially when they are deposited directly onto metal substrates such as, for example, steels.

A possible route for improving the adhesiveness properties of the carbon layer consists in producing an intermediate layer with the aim of adjusting the linear heat expansion coefficients. There may also be mentioned a process described in FR-A-2,596,775, resulting, on a steel substrate, in successively producing a layer of TiN followed by a layer of Ti(CN), then a layer of carbon I-C by thermal evaporation with the aid of plasma. However, the implementation of the process is difficult and its directive nature does not make it possible to treat uniformly the surfaces of articles of complex geometry and/or of large size.

SUMMARY OF THE INVENTION

The object of the invention is to overcome such disadvantages by providing a process for deposition of adherent carbon on metal articles, imparting to the said articles a resistance to frictional wear, to corrosion, and a color.

The subject of the invention is a process in which:

a) the surface of the article is subjected to a thermochemical pretreatment under electric plasma in the vessel under an atmosphere containing reactive species and hydrogen, the reactive species diffusing into and precipitating in the metal matrix of the article to form a diffusion sublayer, and b) a layer of carbon is deposited in vapor phase under electric plasma on the surface thus treated, in the same vessel, the composition of the atmosphere of the pretreatment being gradually modified, on the one hand by introduction of a hydrocarbon and/or of a silane in the gaseous state and, on the other hand, by progressive reduction in the partial pressures of the reactive species employed during the pretreatment, and the maintenance of the hydrocarbon atmosphere for the carbon deposition.

The other characteristics of the invention are:

The vessel atmosphere during the pretreatment contains at least one reactive species chosen from $N_2$, $CH_4$, $C_3H_8$ and $H_2S$, and a silane can also be introduced into it.

The pretreatment temperature is in the range $[350°-900]°$ C. and preferably in the range $[350°-600]°$ C.

The pretreatment is carried out in a vessel which can partially contain an inert gas, the pressure of the atmosphere in the vessel being in a range of $[10^2-10^3]$ Pa.

The vessel atmosphere employed for the carbon deposition operation is composed of at least one gas chosen from aliphatic hydrocarbons (especially alkanes, alkenes and alkynes), aromatic hydrocarbons, cyclanes and silanes.

The vessel atmosphere for the carbon deposition is preferably composed of at least one gas chosen from $CH_4$, $C_3H_8$ and $C_6H_6$ and may additionally include molecular hydrogen.

The temperature employed for the carbon deposition is in the range $[-200°-+400]°$ C., and preferably in the range $[0°-400]°$ C.

The carbon layer is produced in a vessel in which the atmosphere is at a pressure in the range $[10^{-2}-10^{+4}]$ Pa and preferably in the range $[10^2-10^3]$ Pa.

A diffusion sublayer, a transition layer and a carbon layer are produced successively, ensuring a progressive increase in the hardness of the metal towards the carbon layer.

The color imparted to the treated article is a visual means of the quality of the pretreatment and of the carbon layer.

The invention also relates to a metal article comprising on at least a part of its surface a carbon layer produced according to the above treatment process, an article characterised in that:

the treated surface comprises a diffusion sublayer, a transition layer and a layer of amorphous hard carbon;

the transition layer is composed of at least one element of the reactive species, employed for producing the diffusion sublayer of at least one metallic element of the article and of carbon;

the element of the reactive species is nitrogen;

the treated surface is a structural steel for mechanical use, a stainless steel, zirconium or a zirconium alloy, titanium or a titanium alloy, aluminium or an aluminium alloy, a superalloy based on nickel or a superalloy based on cobalt.

BRIEF DESCRIPTION OF THE DRAWING

The description which follows and the attached drawings will make the invention properly understood, all being given by way of guidance.

FIG. 1 shows a diagram of an article seen in section and on which the deposition of a layer of carbon I-C according to the invention has been carried out.

FIG. 2 shows the respective curves of the change in the Knoop surface microhardness in the case of an untreated article made of 35CD4 steel, in the case of a 35CD4 steel article subjected to a simple ionic nitriding treatment and in the case of an article of the same steel comprising a layer of hard carbon I-C according to the process of the invention.

FIG. 5 shows the pitting potential test curves obtained in an aerated solution containing 30 g/l of NaCl at 25° C. in the case of an article made of 35CD4 steel subjected to an ionic nitriding pretreatment and in the case of an article coated with carbon I-C according to the process of the invention

DESCRIPTION OF THE PREFERRED EMBODIMENTS

Figure 3:
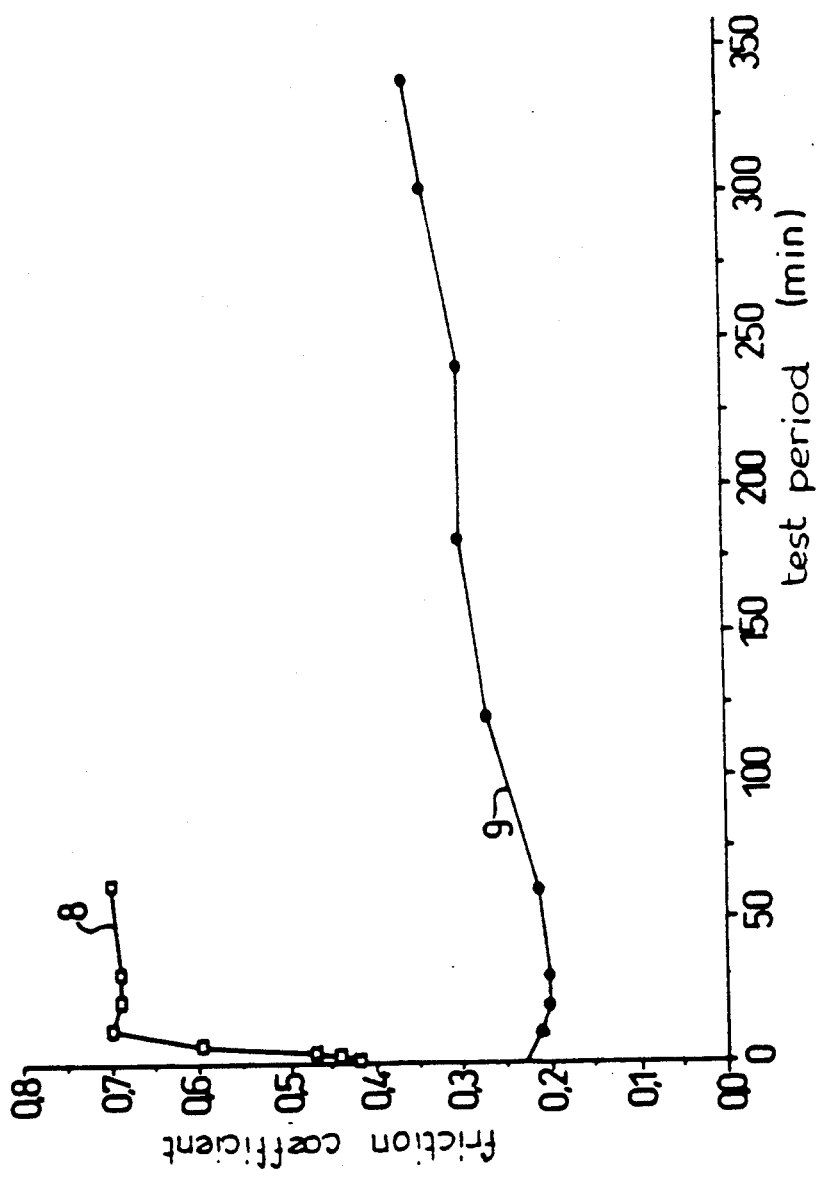
FIG. 3 shows the curves of the change in the friction coefficient as a function of time in the case of an article comprising an ionic nitriding pretreatment and in the case of an article additionally comprising a layer of hard carbon I-C obtained according to the process of the invention.

The surface treatment process of a metal article according to the invention is implemented so as to subject the surface of the latter to a thermochemical pretreatment such as, for example, an ionic nitriding, followed by a chemical deposition of a layer of carbon under electric plasma.

Although carbon is known for its remarkable tribological properties and its very high chemical inertness, it is found that this material is not adhesive when it is deposited as a thin layer directly on an untreated metal surface.

According to the invention a surface of the article is subjected to a thermochemical pretreatment in an atmosphere containing reactive species generated by the action of an electric plasma on gases of the type $CH_4$, $N_2$, $C_3H_8$, $H_2S$ and hydrogen.

Under the effect of the electrical field prevailing in the vicinity of the article, the plasma ions created are accelerated to the surface of the article and produce:
- a heating of the article by dissipation of the kinetic energy as heat energy,
- a scouring of the surface of the article by a cathode sputtering phenomenon,
- a solid-state diffusion of the incident atoms, for example nitrogen, which take up an interstitial position in the crystal lattice of the metal matrix and take part in the precipitation of compounds such as nitrides, these two phenomena resulting in a first surface hardening of the pretreated article, an article comprising a diffusion sublayer.

Bringing the article up to temperature may be ensured either by the ion bombardment alone or by an additional, for example radiant, heating, or else by a means of cooling with circulation, when the effect of the ion bombardment by itself raises the temperature of the article above its treatment temperature.

According to the invention, after pretreatment, a layer of carbon (for example amorphous hard so-called carbon I-C) produced in the same vessel is deposited on the pretreated surface, while progressively modifying the composition of the gas atmosphere of the pretreatment, on the one hand, by the introduction of a hydrocarbon (aliphatic or aromatic) into the said vessel and, on the other hand, by the progressive reduction in the quantity of the reactive species of the pretreatment.

The reactive species of the pretreatment are progressively replaced with reactive species generated by the decomposition of the hydrocarbons in the electric plasma, and this gives rise to the formation of a transition layer and of a carbon layer under the temperature and pressure conditions adjusted for the deposition of the said carbon.

The continuous process in the same single vessel without reexposure to air, that is to say without breaking the vacuum, permits the reaction of a transition layer during the progressive change from the pretreatment to the deposition of carbon, a transition layer which comprises an increasing carbon concentration gradient towards the surface of the carbon layer.

In an example of embodiment according to the invention, an article of steel of the 35CD4 type is subjected to a thermochemical pretreatment in a reactive atmosphere composed of a gaseous mixture of nitrogen and of hydrogen, containing approximately 12% of $N_2$. An electric plasma is created in the vessel at a pressure of 400 Pa by polarising the article to a potential of $-600$ volts and the temperature of the article is controlled at 500° C. for a pretreatment period of approximately 2 hours.

Such a pretreatment makes it possible to produce a nitriding giving rise to a surface hardening of the surface of the article due to a phenomenon of solid-state diffusion and of precipitation in the form of nitride and/or of carbonitride of certain elements contained in the steel, with formation of a surface layer of nitride and/or carbonitride, known as a combination layer. In another form of embodiment and under other conditions it is possible to produce a nitrogen diffusion without the formation of a so-called combination surface layer.

Next, the carbon deposit is produced in the vessel in which the atmosphere includes 10% of $CH_4$ at a pressure of 100 Pa. A neutral gas such as helium can be added to boost the kinetics of deposition. In the case of the carbon layer, the deposition temperature is set at 160° C. A plasma is maintained under these conditions by keeping the article at a voltage of $-700$ volts.

The process is noteworthy in that conditions for surface treatment such as ionic nitriding and conditions for plasma-assisted deposition of a layer of amorphous hard carbon are combined in the same vessel, that is to say pressure and temperature conditions which are very different from each other.

The conditions according to the invention are chosen so as to make it possible to carry out all the process operations continuously under an electric plasma, the respective pretreatment and carbon deposition conditions being different.

The atmosphere permitting the deposition of carbon may additionally contain molecular hydrogen in a proportion in the range of [1 to 50]%. The carbon layer produced is then a hydrogenated carbon layer in which the hydrogen concentration is higher than 1%.

In order to provide the treated article with good tribological properties, a pretreatment, a transition layer and a layer of carbon are produced successively, ensuring an increasing variation in hardness from the hardness value of the article to the hardness value of the carbon layer.

Due to the succession of a pretreatment and of the continuous growth of the carbon layer, the process according to the invention ensures a good adhesion of the said layer to the surface of the metal article.

The process according to the invention makes it possible to obtain a pronounced coloring of the surface of the treated article, an aesthetic coloring of the bluish-black type in the case of a steel article. This colouring permits, on the one hand, a check on the quality of the deposited layer and of the pretreatment from the viewpoint of its uniformity and, on the other hand, after the article has been used, a determination of the degree of its wear by means of the colour change.

The attached figures show the results of characterisation of articles treated according to the process.

FIG. 1 is a sectional diagram of an article comprising a carbon layer produced according to the invention. The metal article 1 has been subjected to a pretreatment forming the diffusion sublayer 2 (a nitriding layer here). During the gradual modification of the composition—especially of the atmosphere—of the pretreatment for the formation of the carbon layer, a transition layer 3 is produced, forming a graduated interface before the growth of the hard carbon I-C layer 4.

FIG. 2 shows the curves of the change in the Knoop surface microhardness (HK) as a function of the applied load (g) in the case of an article made of 35CD4 steel. Curve 5 corresponds to the microhardness test on the article without any treatment, curve 6 corresponds to the article which has been subjected to a pretreatment (2 h nitriding, 520° C.) and curve 7 corresponds to the article with the carbon deposit (4 h, 160° C.) after the same pretreatment.

The ionic nitriding pretreatment produces a first considerable surface hardening of the article. For example, under the chosen pretreatment conditions, the microhardness value of the article, measured under a 50 g load, changes approximately from 500 to 750 HK. The deposition of I-C produces an additional increase in the surface microhardness of the article which is much greater still. The surface microhardness reaches 2300 HK under an applied load of 2 g, in the case of the chosen treatment conditions.

FIG. 3 shows the curves of change in the friction coefficient as a function of time. Curve 8 shows the friction coefficient of an article on which only the pretreatment has been carried out and curve 9 shows the friction coefficient of the article on which the carbon layer has been produced after the same pretreatment.

The tribological behaviour of the article coated according to the process described in the present invention has been tested by means of tests performed on a tribometer of the ball-and-disc type. In this test the article to be tested is a disc with a diameter of 45 mm, rotated at a preselected speed and onto which is applied, with a known and preselected normal load, a stationary ball consisting of a reference material such as, for example, a steel of the 100 C6 type. This test makes it possible to measure the friction coefficient as a function of time under well-defined sliding velocity and normal load conditions and also makes it possible to measure the wear as a function of the test duration either by profile-measurement analysis of the wear trace or by measuring the weight loss of the tested article.

This FIG. 3 shows the beneficial effect of the deposit of carbon I-C which produces a large decrease in the value of the friction coefficient, the coefficient being approximately 0.7 in the case of the article which has been subjected to the ionic nitriding pretreatment and only 0.2 in the case of that which has also received the deposit of I-C, after 25 min of testing.

The friction coefficient of the article with carbon I-C deposit changes slowly with time. Moreover, no appreciable wear could be detected after 325 min of testing in the case of the article coated with I-C, whereas signs of wear of a maximum depth of approximately 1 μm could be detected after only 50 min of testing in the case of the article with only ionic nitriding pretreatment.

Figure 4:
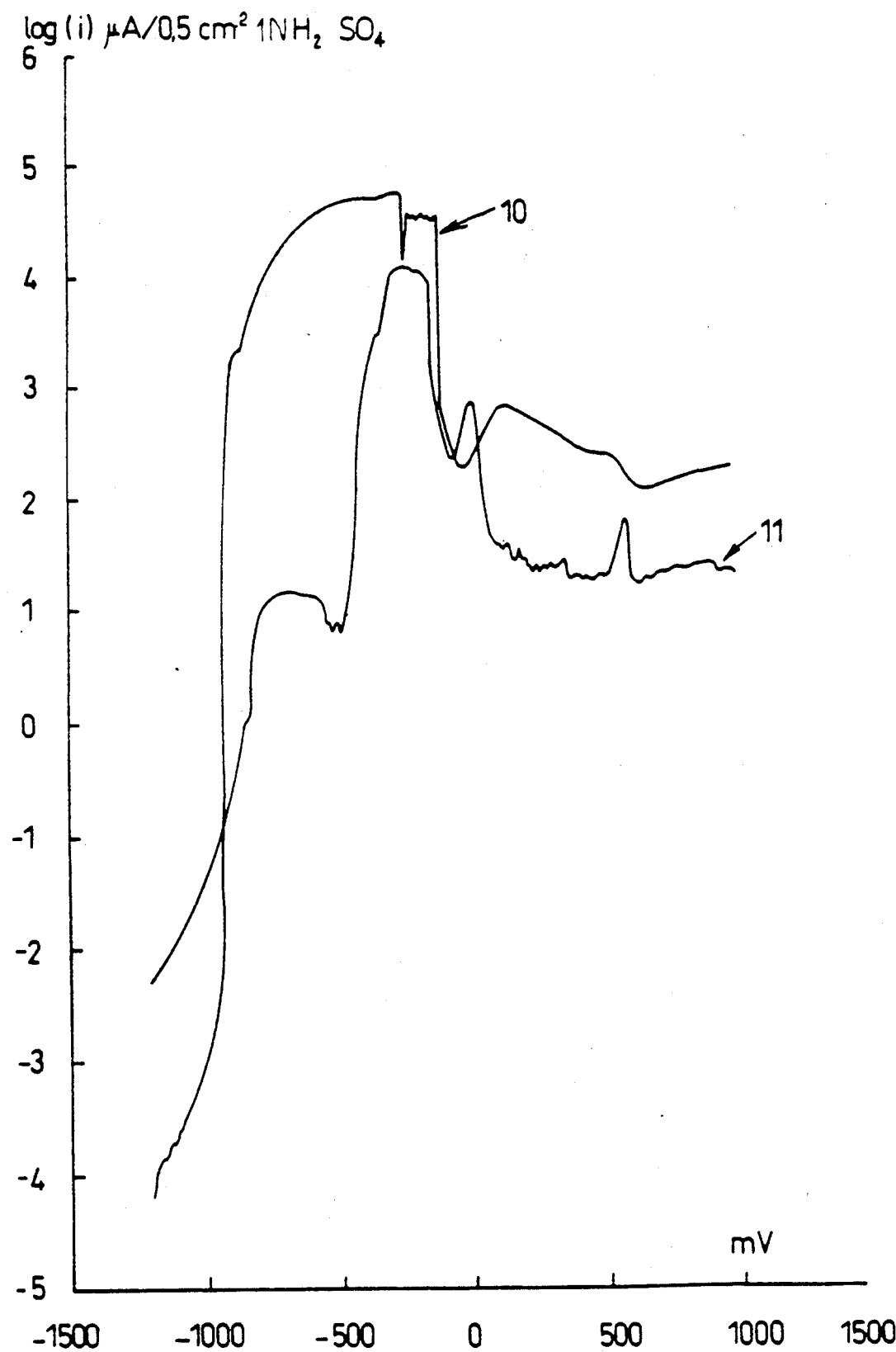
FIG. 4 shows the curves of potentiokinetic measurements obtained in a deaerated 1N solution of sulphuric acid at 25° C. with an untreated article made of 35CD4 steel, and with an article comprising the ionic nitriding pretreatment and coated with carbon I-C according to the process of the invention.

FIGS. 4 and 5 show characteristic curves of potentiokinetic tests carried out, respectively, in a 1N solution of sulphuric acid deaerated by bubbling argon through at 25° C. and in an aerated neutral chloride solution containing 30 g/l NaCl at 25° C., on the one hand on a pretreated article made of 35CD4 steel and, on the other hand, on an identical article pretreated and coated with hard carbon I-C.

The potentiokinetic tests consist in determining the variation in the intensity of the current which flows between the article to be investigated and a so-called counterelectrode (generally a platinum electrode) as a function of the electrical potential applied to the article to be investigated, read off in relation to a so-called reference electrode (generally a saturated calomel electrode, indicated by SCE in the figure).

The potential applied to the article is supplied by a potentiostat. The latter varies linearly as a function of time at a preselected rate. At the beginning of the test the article is the site of a cathodic reaction; at higher potential the surface of the article undergoes oxidation reactions with dissolution of the constituent metal.

A current density (i) curve is thus plotted as a function of the applied potential (scanning speed: 900 mV/h), the examination of which gives a large number of data as to the behaviour of the article in the chosen corrosive medium, in particular with regard to its susceptibility to passivation or to pitting corrosion.

The sulphuric acid solution (FIG. 4) generally produces a corrosion of uniform type in the case of steels, whereas the chloride solution (FIG. 5) produces a localised pitting corrosion in the case of stainless steels.

The potentiokinetic curves of FIG. 4, obtained in sulphuric solution for an article consisting of a 35CD4 steel show that the deposit of I-C produced by the process according to the present invention (curve 11) results in a strong reduction of the activity peak and of the passivation current 11, when compared with an article subjected only to an ionic nitriding pretreatment (curve 10).

The potentiokinetic curves in FIG. 5, obtained in neutral chloride solution for an article consisting of a nitrided 35CD4 steel (curve 13) and an article coated with carbon. I-C produced according to the process described in the present invention (curve 15) show that the process produces a strong increase in the pitting potential of carbon in the case of the carbon I-C deposit. Furthermore, the existence of a passivity range is observed in the case of the article coated with carbon I-C.

We claim:

1. Treatment process for depositing a carbon layer, in vapor phase, in a vessel, on the face of a metal article to impart to this article a resistance to frictional wear, a corrosion resistance, and a color, characterised in that
 a) the surface of the article is subjected to a thermochemical pretreatment under electric plasma in the vessel under an atmosphere containing reactive species and hydrogen, the reactive species diffusing into and precipitating in the metal matrix of the article to form a diffusion sublayer, and
 b) a layer of carbon is deposited in vapor phase on the surface thus treated, under electric plasma, in the same vessel, while gradually modifying the composition of the atmosphere of the pretreatment, on the one hand by introduction of a hydrocarbon and/or of a silane in the gaseous state and, on the other hand, by progressive reduction in the partial pressures of the reactive species employed during the pretreatment, and the maintenance of the hydrocarbon atmosphere for the carbon deposition.

2. Process according to claim 1, characterised in that a silane is additionally introduced into the atmosphere of the pretreatment.

3. Process according to claim 1, characterised in that the atmosphere in the vessel during the pretreatment contains at least one reactive species chosen from $N_2$, $CH_4$, $C_3H_8$ and $H_2S$ 4.

4. Process according to claim 1, characterised in that the temperature of the pretreatment is in the range 350°-900° C.

5. Process according to claim 4, characterised in that the temperature of the pretreatment is in the range 350°-900° C.

6. Process according to claim 1, characterised in that the pretreatment is carried out in a vessel which may partially contain an inert gas, the pressure of the atmosphere in the vessel being in a range of $10^2$-$10^3$ Pa.

7. Process according to claim 1, characterised in that the atmosphere in the vessel employed for performing the carbon deposition is composed of at lest one gas chosen from aliphatic hydrocarbons, aromatic hydrocarbons and cyclanes.

8. Process according to claim 7, characterised in that the atmosphere in the vessel is composed of at least one gas chosen from $CH_4$, $C_3H_8$ and $C_6H_6$.

9. Process according to either of claims 7 and 8, characterised in that the atmosphere in the vessel additionally includes molecular hydrogen.

10. Process according to claim 1, characterised in that the temperature employed for the carbon deposition is in the range 200°-+400° C.

11. Process according to claim 10, characterised in that the temperature employed is in the range 0°-400° C.

12. Process according to claim 1, characterised in that the carbon layer is produced in a vessel in which the atmosphere is at a pressure in the range $10^{-2}$-$10^{+4}$ Pa.

13. Process according to claim 12, characterised in that the pressure is in the range $10^1$-$10^3$ Pa.

14. Process according to claim 1, characterised in that hydrogen is introduced into the carbon layer in a proportion of 1 to 50%.

15. Process according to claim 1, characterised in that a diffusion sublayer, a transition layer and a carbon layer are produced successively, ensuring a progressive increase in the hardness from the metal towards the carbon layer.

16. Process according to claim 1, characterised in that the color is a visual means of the quality of the pretreatment and of the carbon layer.

17. Metal article comprising on at least a part of its surface a carbon layer produced by a treatment process for depositing a carbon layer, in vapor phase, in a vessel, to impart a resistance to frictional wear, a corrosion resistance, and a color, comprising the steps of:
   a) subjecting the surface of the article to a thermochemical pretreatment under electric plasma in the vessel under an atmosphere containing reactive species and hydrogen, the reactive species diffusing into and precipitating in the metal matrix of the article to form a diffusion sublayer, and
   b) depositing a layer of carbon in vapor phase on the surface thus treated, under electric plasma, in the same vessel, while gradually modifying the composition of the atmosphere of the pretreatment, on the one hand by introduction of a hydrocarbon and/or of a silane in the gaseous state and, on the other hand, by progressive reduction in the partial pressures of the reactive species employed during the pretreatment, and the maintenance of the hydrocarbon atmosphere for the carbon deposition,
   wherein said treated surface comprises a diffusion sublayer, a transition layer and a layer of amorphous hard carbon.

18. Article according to claim 17, characterised in that the transition layer is composed of at least one element of the reactive species employed for producing the diffusion sublayer, of at least one metallic element of the article and of carbon.

19. Article according to claim 17, characterised in that the element of the reactive species is nitrogen.

20. Article according to claim 18, characterised in that the transition layer and the carbon layer additionally include hydrogen in their composition in a proportion in the range 1-50%.

21. Article according to claim 18, characterised in that its treated surface is a structural steel, a stainless steel, zirocnium or a zirconium alloy, titanium or a titanium alloy, aluminum or an aluminum alloy, a nickel-based superalloy or a cobalt-based superalloy.

* * * * *